(12) United States Patent
Matsumoto et al.

(10) Patent No.: US 6,515,849 B2
(45) Date of Patent: Feb. 4, 2003

(54) CONTROL DEVICE AND ITS MANUFACTURING METHOD

(75) Inventors: Kazunori Matsumoto, Osaka (JP); Yasushi Mukai, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/817,210

(22) Filed: Mar. 27, 2001

(65) Prior Publication Data

US 2001/0032416 A1 Oct. 25, 2001

(30) Foreign Application Priority Data

Mar. 28, 2000 (JP) .................................... 2000-088019

(51) Int. Cl.⁷ ................................................ H02B 1/00
(52) U.S. Cl. ................ 361/600; 174/52.1; 361/622; 361/679; 361/623; 361/733; 361/752; 361/827
(58) Field of Search ................ 174/52.1, 60, 65 R, 174/65 C, 72 A; 361/600, 622–626, 724, 733, 752, 755, 788, 803, 826–828

(56) References Cited

U.S. PATENT DOCUMENTS 5,398,161 A * 3/1995 Roy ............................ 361/727
6,169,249 B1 * 1/2001 Teachout et al. ............ 361/724

FOREIGN PATENT DOCUMENTS

JP              7-241786          9/1995

\* cited by examiner

Primary Examiner—Gregory Thompson
(74) Attorney, Agent, or Firm—Wenderoth, Lind & Ponack, L.L.P.

(57) ABSTRACT

A small control device can be efficiently assembled. The control device includes a door for releasing a control unit when a general user connects wiring, and a door for releasing a power supply unit for maintenance service. The control device may further include a door locking mechanism, a partition wall for separating the control unit and power supply unit, and a mechanism for mounting components on both sides of the wall in three-dimensional space. A notch may be formed in the wall. Moreover, the control device may include a mechanism for releasing a rear side of a case from the top, and a mechanism for releasing at least one side of the case.

33 Claims, 2 Drawing Sheets

CONTROL DEVICE AND ITS MANUFACTURING METHOD

FIELD OF THE INVENTION

The present invention relates to a control device having a control unit and a power supply unit disposed inside thereof and a method of manufacturing the device.

BACKGROUND OF THE INVENTION

In a control device having a control unit and a power supply unit disposed inside a case, components are attached to the inner side of the case, usually to the lower side or lateral side. In conventional control devices, the case is often designed to be open from only single side, and it is thus difficult to install the components and to connect wiring when the case is reduced in size. Further, the high voltage area of the power supply unit must be enclosed with a cover to prevent electric shock due to a touch during maintenance work, and the assembling of the control device is complicated.

SUMMARY OF THE INVENTION

A small and easy-to-assemble control device, and its manufacturing method is presented.

The control device comprises a case having a control unit and a power supply unit disposed in its inside, a first door at a position corresponding to the control unit in the case, and a second door at a position corresponding to the power supply unit in the case. The control device may further comprise a partition wall between the control unit and power supply unit and between the first door and second door. At least a part of the power supply unit and control unit is disposed at both sides of the partition wall.

DETAILED DESCRIPTION OF THE INVENTION

Figure 1:
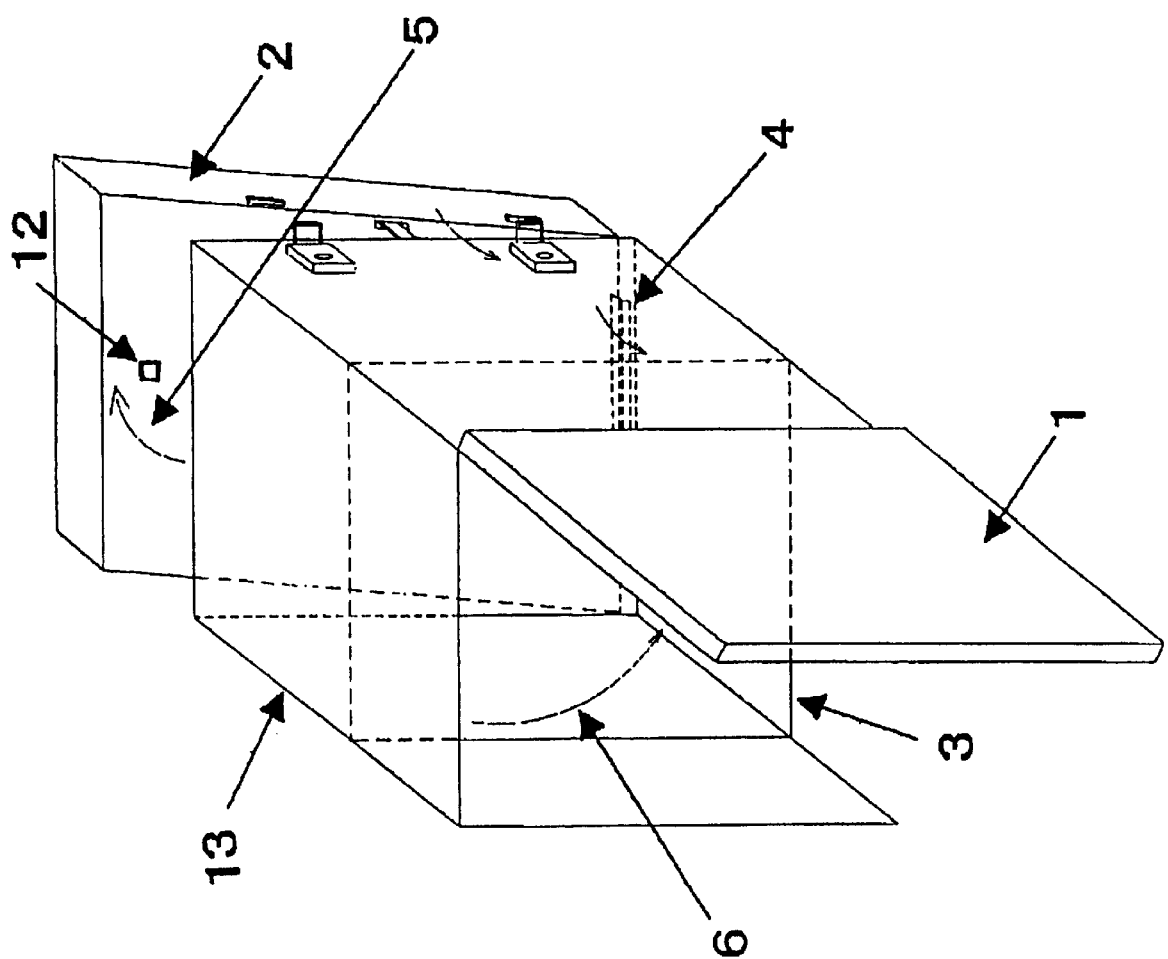
FIG. 1 is a structural diagram of a control device according to an exemplary embodiment of the invention.
Figure 2:
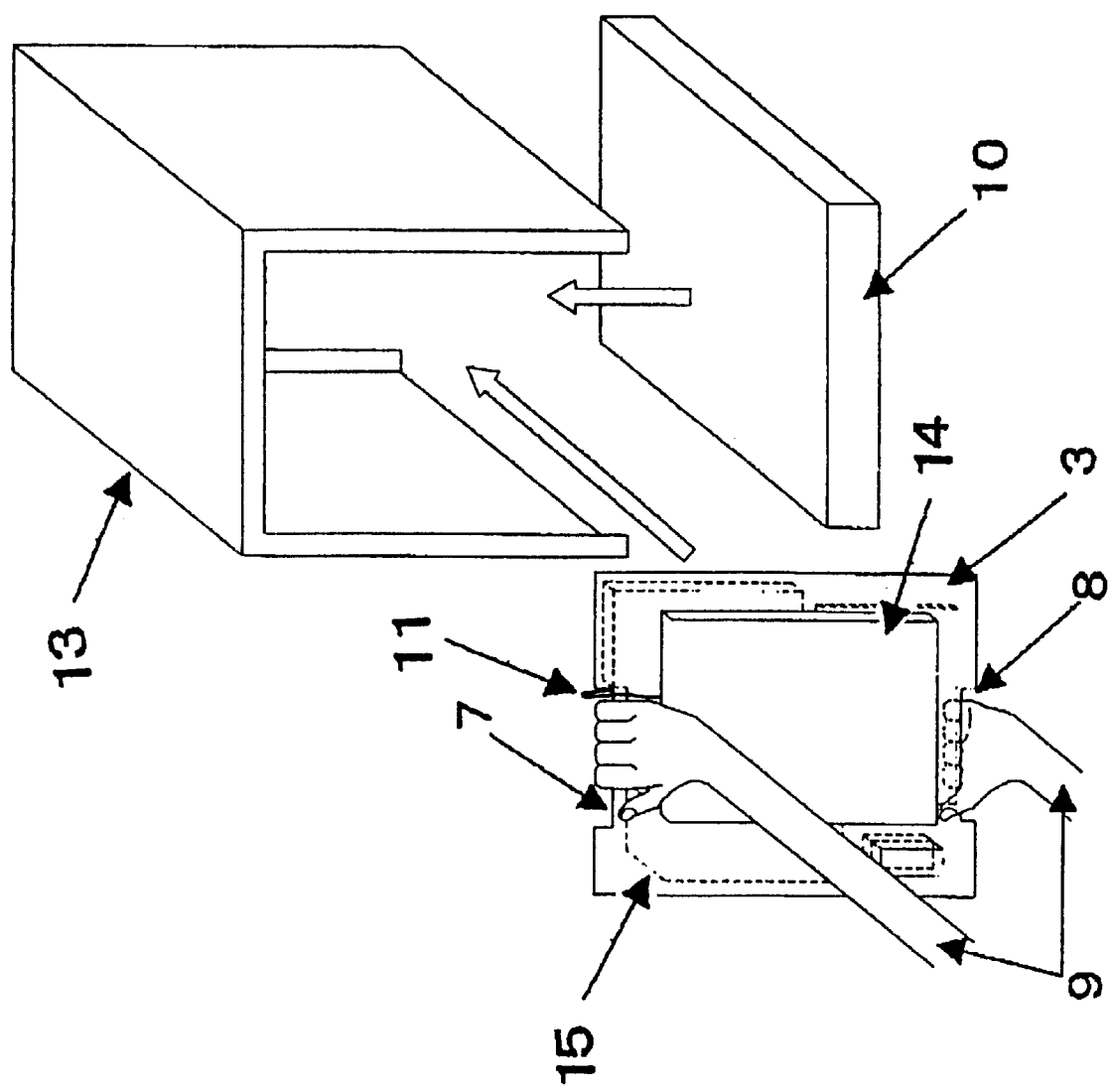
FIG. 2 is a configuration of components of the control device according to the embodiment.

An exemplary embodiment of the invention will be described by referring to FIG. 1 and FIG. 2. FIG. 1 shows the control device after assembly according to the embodiment. FIG. 2 shows the control device before assembly.

In FIG. 1, a door 1 on a case 13 is for opening and releasing a control unit connected by a general user. A door 2 on the case 13 is for opening and releasing a power supply unit 15 to be accessible for maintenance. A partition wall 3 separates the control unit 14 from the power supply unit 15 and mounts components on both its sides.

The door 2 opens only at the time of maintenance and may be locked via a lock mechanism 12 with a key. By this structure, without sacrificing ease of maintenance, the control unit, accessible by the general user for wiring, is isolated from the power supply unit handled only at the time of maintenance. The control device includes the components at high density, and thus, is reduced in size.

A fulcrum 4 is further provided for releasing the door 2 from the top, and the door 2 is hooked on the fulcrum. The weight is supported by the fulcrum 4, and the door 2 can support a heavy object easily. The door 2 may also be detachably provided in the case.

A mechanism stops the releasing of the door 1 or door 2 suppresses the length of the wiring to be just enough to reach the release-stopping position, even if the wiring of the door 1 or door 2 extends to the an access position 5 or an access position 6 to be released. In other words, once the door is opened to the release-stopping position, the wiring connector is removed to free one end of the wiring, and thus, the door 1 or door 2 can be fully opened. Therefore, the wiring is disposed around the door 1 or door 2 more freely, and the length of the wiring is suppressed to be just enough to reach the release-stopping position.

When the control device is assembled, components are mounted on the partition wall 3, and wiring connectable on the partition wall 3 is connected. As a result, the assembling and wiring work in a narrow area in the control device can be done outside the control device, so that the assembling work may be easily performed.

When the partition wall 3 is assembled into the control device, the wall 3 is pushed in with a notch 7 and a notch 8 of the partition wall 3 supported by hands 9. The notch 8 may be omitted if at least one side 10 of the case of the control device is releasable. Thus, the partition wall 3 may be easily assembled into the control device.

Further, cables 11 connecting the control (light current) components and at least high voltage (heavy current) components may pass through the notch 7 or notch 8.

What is claimed is:

1. A control device comprising:
   a control unit;
   a power supply unit;
   a case housing said control unit and said power supply unit inside;
   a first door for opening and closing a first space accommodating said control unit in said case; and
   a second door for opening and closing a second space accommodating said power supply unit in said case; and
   a partition wall located in said case between said control unit and said power supply unit and between said first door and said second door, said partition wall having a first side on which said power supply unit is mounted and a second side on which said control unit is mounted, said second side being opposite to said first side.

2. The control device according to claim 1, further comprising a lock mechanism provided in said second door.

3. The control device according to claim 1, wherein a notch is formed in said partition wall.

4. The control device according to claim 3, further comprising a cable connecting between said control unit and said power supply unit through said notch.

5. The control device according to claim 1, wherein said second door is detachable from said case.

6. The control device according to claim 1, wherein said first door and said second door open in different directions from each other.

7. The control device according to claim 1, wherein said case comprises a side that is detachable from a remainder of said case.

8. The control device according to claim 2, wherein said second door is detachable from said case.

9. The control device according to claim 3, wherein said second door is detachable from said case.

10. The control device according to claim 4, wherein said second door is detachable from said case.

11. The control device according to claim 2, wherein said first door and said second door open in different directions from each other.

12. The control device according to claim 3, wherein said first door and said second door open in different directions from each other.

13. The control device according to claim 4, wherein said first door and said second door open in different directions from each other.

14. The control device according to claim 5, wherein said first door and said second door open in different directions from each other.

15. The control device according to claim 2, wherein said case comprises a side that is detachable from a remainder of said case.

16. The control device according to claim 3, wherein said case comprises a side that is detachable from a remainder of said case.

17. The control device according to claim 4, wherein said case comprises a side that a detachable from a remainder of said case.

18. The control device according to claim 5, wherein said case comprises a side that is detachable from a remainder of said case.

19. The control device according to claim 6, wherein said case comprises a side that is detachable from a remainder of said case.

20. A method of manufacturing a control device including a control unit, a power supply unit, a case, and a partition wall having a notch, the partition wall being provided between the control unit and the power supply unit in the case, said method comprising:

mounting the control unit on a first side of the partition wall;

mounting the power supply unit on a second side of the partition wall opposite to the first side;

connecting the control unit and the power supply unit through the notch via a cable; and assembling the partition wall into the case.

21. A control device comprising:

a control unit;

a power supply unit;

a case housing said control unit and said power supply unit inside;

a first door for opening and closing a first space accommodating said control unit in said case, said first door being rotatable about a rotational axis;

a second door for opening and closing a second space accommodating said power supply unit in said case, said second door being rotatable about a rotational axis that is not parallel with the rotational axis of said first door; and a partition wall located in said case between said control unit and said power supply unit and between said first door and said second door, wherein said power supply unit is mounted on a first side of said partition wall, and wherein said control unit is mounted on a second side of said partition wall opposite to said first side of said partition wall.

22. The control device according to claim 21, further comprising a lock mechanism provided in said second door.

23. The control device according to claim 21, wherein a notch is formed in said partition wall.

24. The control device according to claim 23, further comprising a cable connecting between said control unit and said power supply unit through said notch.

25. The control device according to claim 21, wherein said second door is detachable from said case.

26. The control device according to claim 21, wherein said case comprises a side that is detachable from a remainder of said case.

27. A control device comprising:

a control unit;

a power supply unit;

a case housing said control unit and said power supply unit inside;

a first door for opening and closing a first space accommodating said control unit in said case; and a second door for opening and closing a second space accommodating said power supply unit in said case;

a fulcrum adapted to rotatably support at least one of said first and second doors to said case, said fulcrum being located at a bottom portion of said at least one of said first and second doors; and a partition wall located in said case between said control unit and said power supply unit and between said first door and said second door, wherein said power supply unit is mounted on a first side of said partition wall, and wherein said control unit is mounted on a second side of said partition wall opposite said first side of said partition wall.

28. The control device according to claim 27, further comprising a lock mechanism provided in said second door.

29. The control device according to claim 27, wherein a notch is formed in said partition wall.

30. The control device according to claim 29, further comprising a cable connecting between said control unit and said power supply unit through said notch.

31. The control device according to claim 27, wherein said second door is detachable from said case.

32. The control device according to claim 27, wherein said first door and said second door open in different directions from each other.

33. The control device according to claim 27, wherein said case comprises a side that is detachable from a remainder of said case.

\* \* \* \* \*